July 27, 1965 P. M. KINTNER 3,197,656

TRANSISTOR TIME DELAY CIRCUITS

Filed Aug. 6, 1962 2 Sheets-Sheet 1

INVENTOR
Paul M. Kintner
BY
Pennie Edmonds Morton Barrows & Taylor
ATTORNEYS

INVENTOR
Paul M. Kintner
BY
Pennie Edmonds Morton Barrows & Taylor
ATTORNEYS 3,197,656

TRANSISTOR TIME DELAY CIRCUITS

Paul M. Kintner, Huntington Station, N.Y., assignor to Cutler-Hammer, Inc., Milwaukee, Wis., a corporation of Delaware Filed Aug. 6, 1962, Ser. No. 215,155
3 Claims. (Cl. 307—88.5)

This invention relates to transistor time delay circuits, and particularly to such circuits capable of providing relatively long time delays without excessive cost.

Time delay circuits are widely used in industry for performing a control function, or effecting a switching operation, etc., at some appropriate time after the occurrence of an event. The event may be the closing of a switch, completion of a previous operation, etc. Frequently time delays of many seconds are desired.

Resistor-capacitor (R-C) time delay circuits are often employed in such circuits. For example, a capacitor may be initially charged, and then allowed to discharge through a resistor. Or, the capacitor may be charged through a resistor. At some threshold level during the charge or discharge, an appropriate switch circuit is actuated. The charging voltage, the threshold level at which the switching circuit is actuated, and the R-C time constant of the resistor-capacitor circuit are important in determining the amount of delay that can be obtained. For long time delays, relatively large values of resistance and capacitance are required.

At the present time, transistors are widely used in industrial electronic circuits and elsewhere because of their reliability, low voltage and low current requirements, etc. Transistor switch circuits are known which are relatively simple and inexpensive. However, such circuits commonly have a fairly low input impedance, particularly when low cost transistors are employed. Also, a certain minimum current is required to trigger a circuit from one state to the other.

For example, simple switch circuits employing low cost germanium transistors may have input impedances of a few hundred or few thousand ohms, and it is difficult to obtain input impedances higher than of the order of 100,000 ohms. It is possible to obtain high input impedances with silicon transistors, but these are more expensive and for some applications the impedance may still not be satisfactorily high. Triggering currents of the order of one or two milli-amperes are commonly required.

When such transistor switch circuits are employed with R-C time constant circuits, the impedance nad current requirements present a serious obstacles to the development of long time delays, unless excessively large and expensive capacitors are employed. If the transistor circuit is connected directly across the capacitor, the resistor should have a value which is small compared to the input impedance of the transistor circuit in order that the charge or discharge will be controlled primarily by the resistor. Thus very large values of capacitance are required for long time delays. For example, with a 1000 ohm resistor, a 10,000 microfarad capacitor would be required to give a time constant of ten seconds. While such capacitances can be obtained with electrolytic capacitors, such capacitors have wide tolerance and their capacitances are highly sensitive to temperature, thus rendering them unsuitable for producing reasonably accurate time delays. More stable capacitors, with satisfactorily small tolerances, become very expensive in such large sizes. Further, time constants greater than 10 seconds may often be desired. Even if the transistor circuit is designed so that a higher resistance can be employed, the capacitance required will often be unduly high.

Simple expedients for reducing the shunting effect of the transistor circuit, such as employing a large series resistance in the input circuit thereof, are not satisfactory in view of the triggering current requirement and possible loss in sensitivty.

It is a principal object of the present invention to provide a circuit in which relatively large resistances and moderate values of capacitance can be employed to obtain long time delays, with comparatively inexpensive low impedance transistor switch circuits.

In accordance with the present invention, an R-C time delay circuit is used and a diode is placed in series between the time delay circuit and the transistor switch circuit so that the circuits are substantially isolated until the desired delay point is reached. Thus the transistor circuit has little, if any, effect on the R-C time delay circuit. Then, repetitive pulses are applied to the circuit including the diode and transistor input circuit which periodically add to the delay voltage output of the R-C circuit, and switch the transistor circuit when the added voltages exceed a switching threshold level. The added pulses assure the supply of adequate current to effect switching, without significantly affecting the charge or discharge of the capacitor of the R-C delay circuit. Also, with pulses of sufficient magnitude, switching takes place well before the capacitor becomes fully charged or discharged, hence occurring before the asymptotic region is reached and promoting more accurate time delays.

As will be explained hereinafter, the relationship between the pulse periodicity and other circuit parameters is important in order to supply sufficient current for reliable switching when the desired time delay has been obtained.

The invention will be described in connection with specific embodiments thereof in which further advantages will in part be pointed out and in part be obvious to those skilled in the art.

Figure 1:
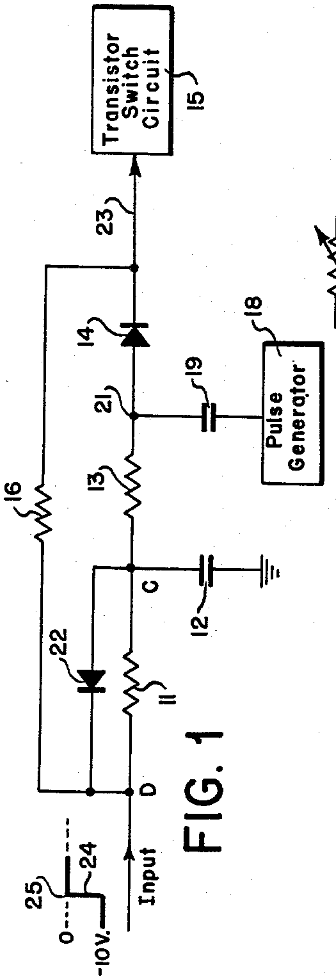
FIG. 1 is a time delay circuit in accordance with the invention, with portions indicated by blocks.

Referring now to FIG. 1, a time delay circuit including series resistor 11 and shunt storage capacitor 12 is connected between the input terminal D and ground. Terminal C of capacitor 12 is connected through resistor 13 and diode 14 to the input circuit of the transistor switch circuit 15. Diode 14 is poled to be non-conducting until switching is to take place. Resistor 16 is a reset resistor for the switch circuit 15. A pulse generator 18 supplies pulses through capacitor 19 to the junction point 21. Reset diode 22 is connected across resistor 11.

It is here assumed that the transistor switch circuit is in one state when the potential of line 23 is considerably negative to ground, and is triggered to its opposite state when the potential of line 23 is at or near ground and sufficient current is supplied thereto. An appropriate input signal is indicated at 24. Initially the signal level is considerably negative to ground, and −10 volts is specifically indicated. For this initial condition, reset diode 22 conducts a charge capacitor 12 rapidly until the potential thereacross is substantially equal to the input potential. Thus, under the initial conditions, the potential of point C will be substantially −10 volts. The negative input potential is supplied through resistor 16 to input line 23 of the transistor switch circuit 15, thereby establishing its initial state.

When the input signal 24 goes to ground, or close to ground, at point 25, reset diode 22 is cut off (rendered non-conductive) and capacitor 12 starts to discharge through resistor 11, thereby providing a delay voltage output. Line 23 will then be connected through resistor 16 to approximately ground, but it is assumed that resistor 16 is sufficiently large so that adequate current for triggering circuit 15 is not supplied thereto, so that the switch circuit will remain in is initial condition. Diode 14 will be initially non-conducting.

For the assumed polarity of input signal 24, pulse generator 18 is arranged to supply positive-going pulses through capacitor 19 to point 21. The pulse amplitude is less than the initial voltage on capacitor 12, for example 5 volts. As capacitor 12 discharges through resistor 11, the voltage at point 21 will be equal to that at point C, with periodic positive excursions due to the pulses from generator 18. When capacitor 12 is discharged sufficiently, and with proper selection of pulse periodicity in relation to other circuit parameters, the pulse excursions at point 21 will rise sufficiently above the potential of line 23 to cause diode 14 to conduct and deliver current through line 23 to trigger the transistor switch circuit 15 to its opposite state.

Semiconductor diodes are available at moderate cost having a very high reverse resistance and a low forward resistance. For example, silicon diodes having a reverse leakage current of the order of $10^{-9}$ amperes are readily obtainable, thus giving a reverse resistance of the order of 100 megohms at 10 volts. During the initial portion of the delay voltage output, with diode 14 non-conducting, the transistor switch circuit 15 is isolated from capacitor 12 and does not significantly affect the discharge of the capacitor even though it may have a very low input impedance. Also, diode 22 will have a high reverse resistance and will not substantially affect the discharge of the capacitor. Accordingly, the capacitor 12 initially discharges almost entirely through resistor 11. With a stable resistor 11 and a stable capacitor 12, the rate of discharge for a given initial voltage may be accurately controlled.

With the transistor circuit isolated, large resistors can be employed for 11. The maximum value will depend on the actual reverse resistance of the diode and the required precision of the time delays. Values up to, say 10 megohms can usually be employed without requiring unduly expensive diodes. Thus large time delays can be obtained with moderate values for capacitor 12. However, the current which can pass through such a large resistor, with the customary low voltage power supply, will be far too low for switching purposes.

Further details of the operation will be described in connection with FIGS. 2 and 3.

Figure 2:
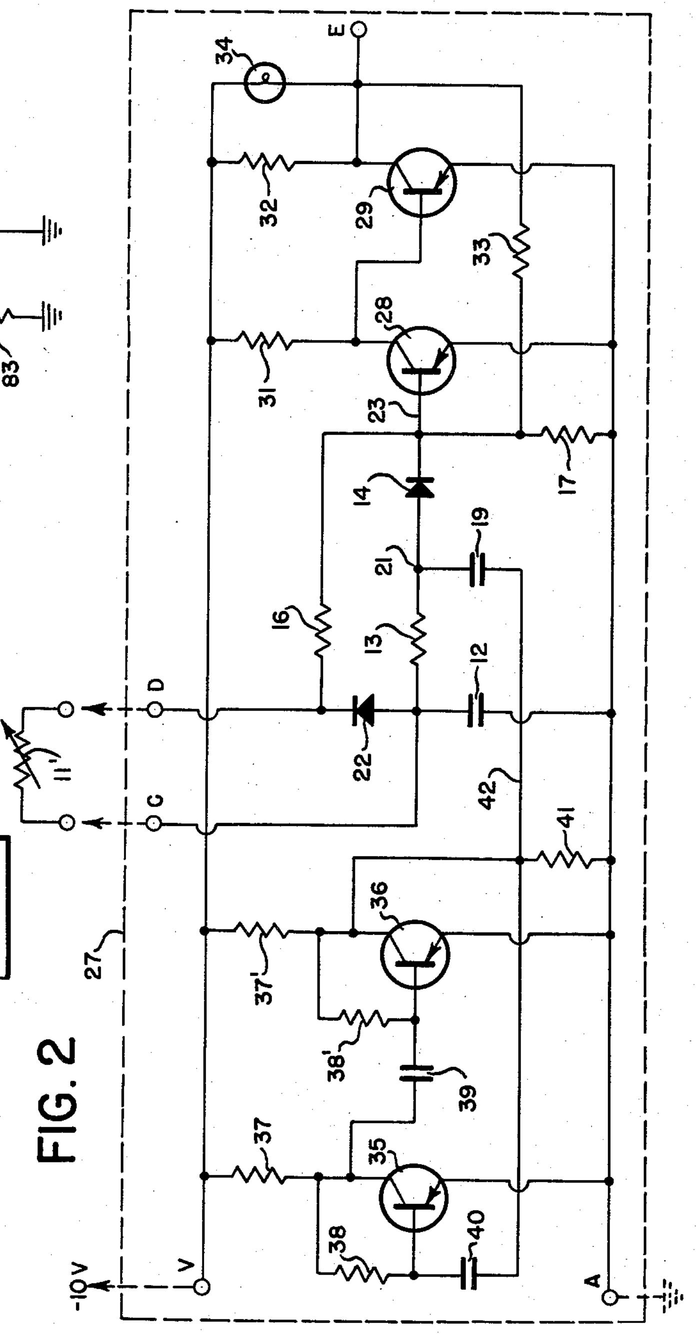
FIG. 2 is a detailed circuit diagram of one specific embodiment of the invention.

Referring now to FIG. 2, a time delay circuit with a transistor switch circuit and transistor pulse generator are shown in modular form for convenient use. The circuit components are mounted on a module board indicated by the dotted line 27. Terminals A and V are provided which, in use, are connected to ground and —10 volt supply as indicated. Terminals C and D are the same as shown in FIG. 1, but the time constant resistor 11 is now shown as an external variable resistor 11'. This enables the user to select various values of resistance, or to use a rheostat, so that different time constants can be obtained. Thus, the user can obtain any time delays within the range for which the module is designed. Other circuit components of FIG. 1 bear the same numerals in FIG. 2.

The transistor switch circuit 15 of FIG. 1 is shown in FIG. 2 as a bistable multivibrator or "flip-flop" including transistors 28 and 29. These are shown as of the PNP type. Briefly, with the emitters grounded as shown, and the collectors connected to a minus power supply through load resistors 31, 32, a given transistor will be in its "on" (conducting) condition when its base is sufficiently negative to the emitter, say —250 millivolts. The transistor will be "off" (non-conducting) when its base is positive to the emitter, or less than a small negative potential depending upon the transistor. The collector of transistor 28 is direct-coupled to the base of 29, and the collector of 29 is connected back to the base of 28 through feedback resistor 33. A lamp 34 is provided to indicate the state of the switch circuit and forms part of the collector load of transistor 29. The output is provided at terminal E.

Assuming that transistor 28 has its base initially held negative by the negative voltage applied from terminal D through resistor 16, transistor 28 will be on and its collector will be at nearly ground potential. Resistor 17 is primarily a ground return for the base-emitter circuit of transistor 28 for minimizing thermal currents therein. Due to the direct coupling, transistor 29 will be off and the output in line E will be considerably negative, the exact amount depending on the external load conected to E. This negative potential will be fed back through resistor 33 to the base of transistor 28, thereby maintaining it in its "on" condition. To turn transistor 28 off, the input line 23 must be brought close to or above ground potential and sufficient current applied to its base-emitter circuit to overcome the feedback current through resistor 33. When this is done, transistor 29 will be turned on, thereby bringing the output line E to nearly ground potential. The ground potential will be effective through resistor 33 to maintain transistor 28 cut off until overcome by a subsequent return of input D to a negative voltage.

The switch circuit including transistors 28, 29 is similar to those described in my U.S. application Serial No. 143,971, filed October 9, 1961 for "Modules," and reference may be made thereto for further details if desired.

The pulse generator 18 of FIG. 1 is shown in FIG. 2 as comprising transistors 35 and 36. These are of the PNP type and have their emitters grounded and their collectors connected through load resistors 37, 37' to the negative power supply. Bias is applied to the bases through resistors 38, 38'. The collectors and bases are intercoupled by capacitors 39 and 40. Transistor 36 also has an output load resistor 41.

This is an astable multivibrator, as will be understood by those skilled in the art. By selecting appropriate values of resistors 38, 38' and capacitors 39, 40 to yield different time constants, asymmetrical pulse operation may be obtained. Thus if resistors 38 and 38' are equal, and capacitor 39 is considerably larger than 40, transistor 36 will be off for a considerably longer time than transistor 35. In one particular embodiment the constants were chosen to give output pulses in line 42 having a width of approximately 1.2 milliseconds and a pulse separation of about 13 milliseconds, yielding a pulse period of about 14.2 milliseconds. The values of resistors 37' and 41 were chosen so that, when transistor 36 was off, the potential of line 42 was approximately —5 volts. When transistor 36 is on, the potential of line 42 is substantially ground.

Figure 3:
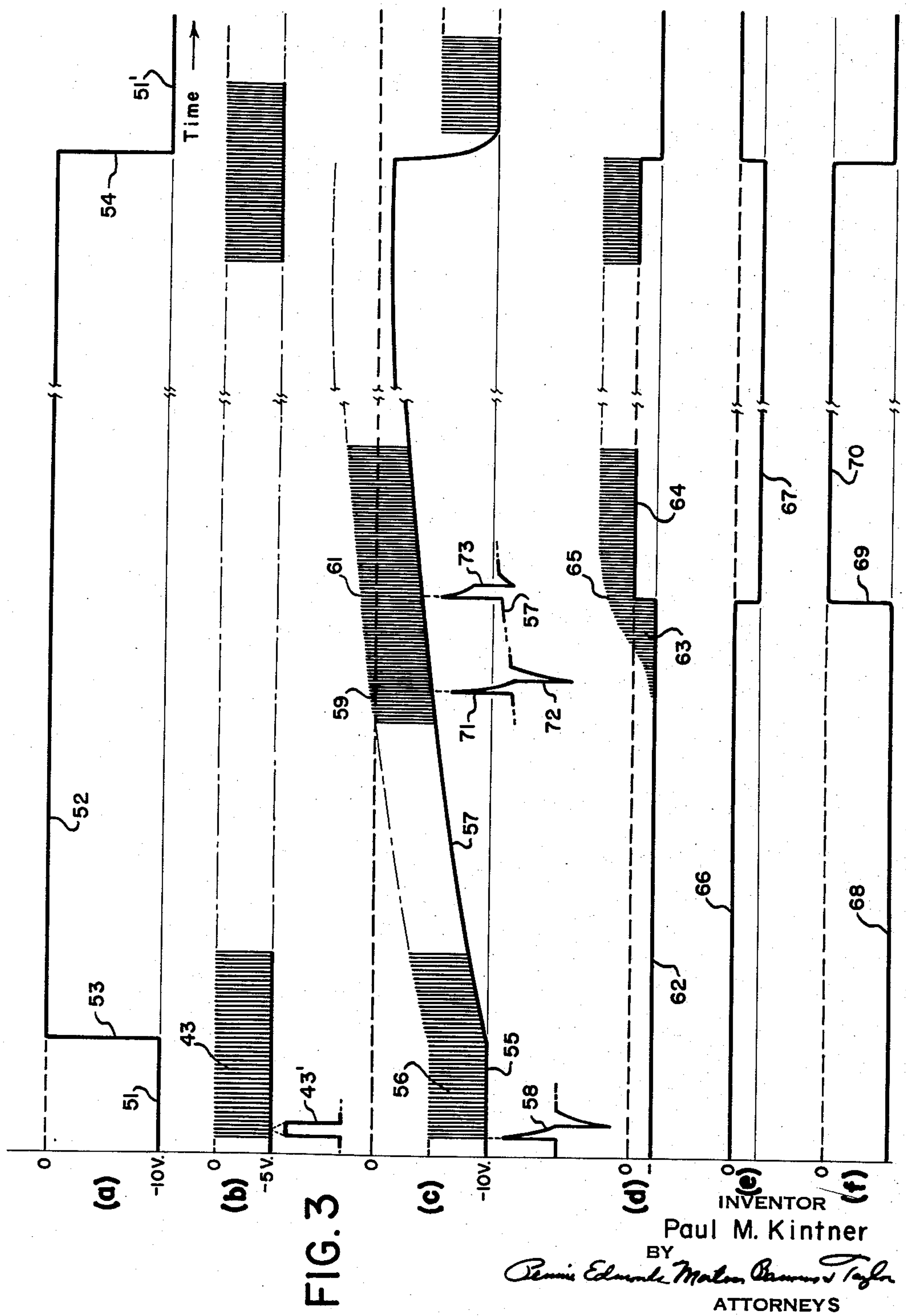
FIG. 3 shows waveforms applicable to the circuit of FIG. 2.

Referring now to FIG. 3, an illustrative input signal is shown in FIG. 3($a$) which changes between two levels 51 and 52. It is here assumed that level 51 is —10 volts and level 52 is at ground potential, as in waveform 24 of FIG. 1.

This signal is applied to input terminal D of FIG. 2. While the signal is at level 51, capacitor 12 is charged to substantially the potential of that level through diode 22, as described before. When the level changes from 51 to 52, at point 53, the time delay is initiated. After the desired time delay has been obtained, the input signal can return to its initial level 51', as indicated at 54. Since delays of many seconds, say up to 100 seconds, can be obtained, the time difference between 53 and 54 may equal or exceed that value.

The pulses 43 shown in FIG. 3($b$) are those in line 42 of FIG. 2, and recur at a sufficiently high frequency to give the desired accuracy of time delay. In one particular embodiment the pulses recurred at the rate of about 70 per second. Thus, many hundreds of pulses may occur while the input signal remains at level 52. These pulses may be very short if desired, say of the order of microseconds. However, it is simpler and less expensive to generate somewhat longer pulses, and in one particular embodiment they were approximately 1.2 milliseconds long. One pulse 43 is shown time-expanded at 43′ to indicate this.

FIG. 3(*c*) illustrates the potential at point 21 in FIG. 2. Initially the potential will be −10 volts as shown at 55, due to the charging of capacitor 12 during reset, with periodic excursions due to the pulses applied through capacitor 19. With very short pulses 43, the pulse excursions at point 21 will be of very nearly the same shape. However, with somewhat longer pulses there may be some change in shape, so that the pulses in FIG. 3(*c*) are designated 56. When the input signal goes to level 52, resistor 11′ is returned to ground, and capacitor 12 begins to discharge therethrough toward the input level 52. The exponentially decaying curve 57 shows the resulting change in voltage on capacitor 12, this voltage being present at point 21 through resistor 13. Curve 57 discharges toward ground potential although, as will be explained hereinafter, the switching takes place before the end of the discharge.

With applied pulses of substantial width, as shown at 43′, some differentiation of the pulses will be present at point 21, due to the presence of resistor 13. This resistor may have a relatively low value, say 4.7 kilohms. A differentiated pulse is shown at 58. This shows an initial positive excursion equal in amplitude to that of a pulse 42, followed by a decay during the pulse duration and then a negative excursion. Only the positive excursions are shown at 56, since they are of most significance.

During the pulses there will be some interchange of charge between coupling capacitor 19 and storage capacitor 12. However, capacitor 19 may be made small compared to capactior 12, so that the interchange causes only a very slight perturbation of the voltage on capacitor 12. Further, inasmuch as capacitor 12 is substantially isolated by diode 14 during the initial portion of the discharge, there will be no net transfer of charge to it and its voltage will be substantially the same before and after a pulse occurrence. It will be understood that the amount of differentiation will depend on the time constant of capacitor 19 and resistor 13, and also on the pulse width, so that the exact shape of waveform 58 may depart widely from that shown.

During the initial portion of the discharge curve 57, similar differentiation of pulses 43 will occur, with substantially no effect on the discharge of capacitor 12. However, as the discharge of capacitor 12 proceeds, eventually a point will be reached where the positive pulse excursions start to rise above ground, as indicated at region 59. Diode 14 will then conduct momentarily and supply current to the base-emitter circuit of transistor 28. The impedance of this circuit may be quite low, and impedances of the order of a few hundred ohms have been employed with success. However, with a very small forward voltage applied to diode 14, its resistance will still be fairly high so that little current can pass therethrough.

In general, a transistor switch circuit requires a given amount of current to be supplied to its input for a sufficient length of time to allow switching action to take place. In one particular embodiment, a current of one or two milliamperes lasting for a few microseconds was required. With a small capacitor 19, and a relatively slow decay of curve 57, the initial pulse excursions above ground will in general not trigger the transistor circuit. However, if the pulse repetition rate is not too high, as will be discussed below, the capacitor 12 continues to discharge and the pulses will rise more and more above ground until a point is reached at 61 where sufficient current is applied to the transistor input circuit for a sufficient length of time to produce switching. Thereafter, capacitor 12 may continue to discharge, with pulses superposed on the voltage thereof, but this is unimportant inasmuch as switching has taken place.

FIG. 3(*d*) shows a representative voltage condition at the base of transistor 28. Prior to switching, the base voltage is negative, as indicated by line 62, due to the feedback current through resistor 33 and the base emitter impedance. This may be of the order of −250 millivolts. When the added storage capacitor and pulse voltage first begins to go above ground at region 59, a small current will flow through the base emitter circuit of transistor 28, causing small positive-going excursions, as shown at 63. During this interval, the current through diode 14 will be insufficient to counteract the feedback current through resistor 33, so that the transistor 28 will not be switched off. When the current through diode 14 becomes sufficient to cause switching, as explained above, transistor 28 will be cut off, thus turning on transistor 29 and bringing the base of transistor 28 to substantially ground potential, as shown at 64. The switching is assumed to take place at point 65. Thereafter, the continuous application of pulses through capacitor 19 will produce positive pulse excursions of the voltage at the base of transistor 28, but these will be unimportant since the switching has already taken place.

FIG. 3(*e*) shows the collector potential of transistor 28. Initially, with the transistor on, the collector potential will be substantially ground, as shown at 66. Upon switching, transistor 28 is cut off and the collector assumes a negative potential, as shown at 67. This potential will be determined by the value of resistor 31 and the base-emitter impedance of transistor 29, together with the applied voltage, and may be of the order of −250 millivolts.

FIG. 3(*f*) shows the voltage at the collector of transistor 29 and output terminal E. Initially, with transistor 29 cut off, the output voltage at terminal E will be negative, as indicated by line 68, the actual value depending upon the power supply voltage, the combined resistance of 32 and lamp 34, and the external load connected to terminal E. Upon switching, transistor 29 is turned on at point 69 and the output voltage at terminal E is substantially at ground potential, as indicated at 70.

This completes the production of a delayed output signal corresponding to the initial change in the input signal at 53 of FIG. 3(*a*). Upon termination of the input signal at 54, the input signal level goes negative to level 51′. Consequently, the potential of line 23 is made negative through resistor 16, and sufficient current is supplied to the base-emitter circuit of transistor 28 to overcome the feedback current through resistor 33 and turn the transistor on, thus restoring its initial condition. At the same time, diode 22 conducts to quickly charge capacitor 12 to the negative level 51′. Thus, the delay circuit is ready for another delay switching operation.

Considering now the periodicity of pulses 42 from generator 18, when the pulses start to go above ground in region 59, current can flow in both directions from point 21 of FIG. 2. In the direction through diode 14, the diode impedance will have a marked effect on the magnitude of current flow. Diodes commonly do not change instantaneously from a very high to a very low impedance in passing from reverse to forward conducting regions. Rather, for very small voltages in the forward region the diode resistance will still be comparatively high but will decrease as the forward voltage increases. Thus, as the pulses go above ground, or the slightly negative potential of line 23, the diode impedance will initially be fairly high.

At the peak of the positive excursion 71 of the differentiated pulse at this point, some current will flow through the diode and some to the capacitor 12. The relative amounts will depend on the diode impedance and the value of resistor 13. Below this peak, and on the negative excursion 72, the diode will be cut off. The current flow to and from capacitor 12 will no longer be equal and opposite in direction, since at the positive peak some current has flowed through diode 14 but none thereafter. Consequently, the net effect is to slightly depress the voltage on capacitor 12. That is, the pulses add slight negative increments to the voltage of capacitor 12. If the pulse periodicity is too high, the decay of the voltage on capacitor 12 due to discharging through resistor 11′ will be counterbalanced by the negative increments added by the pulses, and the pulse excursions above ground will reach an equilibrium value before sufficient current flows through diode 14 to the transistor input circuit for a sufficient length of time to produce switching. Accordingly, the pulse periodicity is made sufficiently low so that the negative increments of voltage on capacitor 12 will not completely overcome the discharge thereof through resistor 11′ until sufficient current flows through diode 14 to trigger the transistor switch circuit. At the same time, the pulse period should be short compared to the desired time delay so that an accurate delay can be obtained.

Waveform 73 illustrates a typical waveform which may exist at the switching point, and it will be seen that the positive excursion with respect to the exponentially decaying curve 57 is greater than the negative excursion. After triggering, the peak pulse voltages may continue to rise somewhat above ground, but will eventually reach an equilibrium value. However, since switching has taken place, this is unimportant.

By making the pulse amplitude sufficiently high, triggering takes place part way along the exponential curve 57 where the slope is substantial. For example, triggering may take place at half amplitude of the discharge. This slope is taken into account along with the pulse periodicity, size of capacitor 19, etc., to insure that the change in the exponentially decaying voltage between pulses is somewhat greater than the negative increment of charge added during the pulse occurrence.

Variation in the initial charge on capacitor 12 will change the voltage-time characteristic of the discharge. By using a common power supply for producing the input signal and the pulses, the pulse amplitude will vary proportionally to the initial charge on capacitor 12, and hence provide compensation to assure accurate time delays. As an aid to the ready practice of the invention, in one specific embodiment the circuit components of FIG. 2 had the values listed below. It will be understood that these are given for illustration only, and that the invention is in no way limited thereto.

| | |
|---|---|
| Resistors: | |
| 17, 32 | 470 ohms. |
| 31, 41 | 820 ohms. |
| 37, 37′ | 1 kilohm. |
| 16, 33 | 3.3 kilohms. |
| 13 | 4.7 kilohms. |
| 38, 38′ | 18 kilohms. |
| 11 | 1 megohm. |
| Capacitors: | |
| 19, 40 | 0.1 mfd. |
| 39 | 0.82 mfd. |
| 12 | 82 mfd. |

The PNP transistors were type 2N404, and the silicon diodes were type DR1088. With a variable 1 megohm resistor 11′, time delays from a fraction of a second to about 60 seconds could be obtained.

Figure 4:
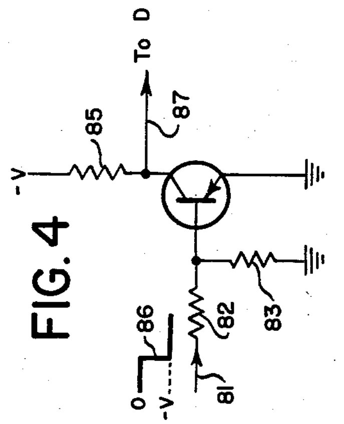
FIG. 4 shows a circuit suitable for supplying signals to the circuit of FIG. 2.

Referring now to FIG. 4, a transistor circuit is shown which is suitable for applying input signals to terminal D of FIG. 2. An input signal at line 81 is voltage divided by resistors 82 and 83, and applied to the base of transistor 84. The emitter is grounded and the collector connected through resistor 85 to a −V power supply. This may be the same −10 volt power supply as applied to the circuit of FIG. 2. An illustrative input signal is shown at 86. When the input signal is at or near ground potential, the transistor 84 will be off and a negative potential will exist in output line 87. By making resistor 85 small compared to the combined series value of resistors 16 and 17 in FIG. 2, substantially the full negative power supply voltage will be applied through line 87 to input terminal D of FIG. 2. When the input signal 86 goes negative, transistor 84 will be turned on, thereby bringing the potential of line 87 and terminal D of FIG. 2 substantially to ground potential. Thus, the circuit of FIG. 4 functions as a polarity inverter and supplies a signal to the input of FIG. 2 as shown in FIG. 3(*a*).

In computing applications using binary circuits, a relatively positive signal is often considered to be a binary "1" and a relatively negative signal a binary "0." With this notation, the application of a binary "1" to terminal D of FIG. 2 will give a delayed binary "1" at output terminal E. In some cases, it may be desired to provide a module which will be actuated by a binary "0" to give a delayed "0" output. In such case, the circuit of FIG. 4 may be incorporated in the module of FIG. 2 so that the negative-going value of waveform 86, representing a binary "0," will initiate the delay action. Then, an inverting transistor stage may be added after transistor 29 to give a delayed binary "0" output.

Many variations of the specific embodiments described are possible. If it is desired to use NPN transistors rather than the PNP transistors described, voltages will be inverted as will be understood by those skilled in the art. Also, rather than initially charging storage capacitor 12 to a predetermined voltage and allowing it to discharge through the series resistor 11, modifications may be made to initially discharge the capacitor and then charge it toward a desired level in response to an input switching signal. In the embodiment shown, the pulses are superposed on the storage capacitor voltage at the diode 14. However, the pulses may be inserted elsewhere in the circuit comprising diode 14 and the input circuit of transistor 28, while yielding a total effective voltage applied to the circuit representing the capacitor voltage with pulses repetitively superposed thereon.

The transistor switch circuit and pulse generator circuit shown in FIG. 1 are simple and have been found satisfactory in practice. However, other types of switch circuits and pulse generators may be employed if desired.

I claim:

1. A time delay circuit which comprises (a) an input circuit for receiving an input signal changing between first and second levels, (b) said input circuit including a time delay circuit having a series resistance and shunt capacitance, (c) a reset diode connected in shunt with the series resistance and poled to bring the voltage on said capacitance substantially to the first level of the input signal upon the occurrence thereof, (d) the capacitance discharging through the series resistance toward the second level of the input signal upon the occurrence thereof, (e) a transistor switching circuit having input and output circuits, (f) means for establishing a threshold switching level of the transistor input circuit at substantially the second level of the point signal upon the occurrence thereof, (g) a resistance and diode connected in series between the shunt capacitance and the transistor input circuit in the order named, (h) said diode being poled to be initially substantially non-conductive when the input signal changes to said second level and thereby substantially isolate the time delay and transistor input circuits, (i) a second capacitance small compared to said shunt capacitance and connected to the junction of the last-mentioned resistance and diode, (j) and means for applying repetitive pulses to the second capacitor having an amplitude less than the difference between the input signal levels to periodically add pulse voltages to the shunt capacitance voltage at said junction, (k) the period of the pulses being predetermined to yield added voltages passing above said threshold switching level during the discharge of the shunt capacitance sufficiently to switch the transistor switch circuit to the opposite state thereof and being short compared to the time delay between the change of the input signal to the second level and the switching.

2. A time delay circuit in accordance with claim 1 in which the input impedance of the transistor switch circuit is lower than the series resistance of the time delay circuit and the input current required for switching is substantially larger than the current through said resistance.

3. Apparatus adapted to receive an input signal that changes from a first level to a second level and to operate in response thereto at the end of a predetermined delay time following such change, comprising:

(a) a time delay circuit including a storage capacitor and a discharge resistor having an RC product predetermined in accordance with the length of said delay time, (b) means for charging said capacitor to said first level when said input signal is at its first level, and for gradually discharging said capacitor through said resistor from said first level toward said second level throughout said delay time when said input signal is at said second level, (c) threshold means having an input circuit and adapted to change from one condition to another in response to a voltage applied to said input circuit exceeding a predetermined threshold level, said threshold level being substantially higher than said first level, the impedance of said input circuit being substantially lower than the resistance of said discharge resistor.

(d) means for producing a train of repetitive voltage pulses having a repetition period substantially shorter than said delay time, the amplitude of said pulses being less than the difference between said threshold level and said first level, and greater than the difference between said threshold level and the voltage across said capacitor at the end of said delay time, (e) means for additively combining said pulses with the voltage across said capacitor to produce a resultant voltage that pulsates between a lower value and an upper value, said upper value being higher than the voltage across said storage capacitor, and (f) means including a substantially unilaterally conductive device for applying said resultant voltage to said input circuit of said threshold means, said unilaterally conductive device being poled in opposition to the voltage across said storage capacitor to isolate said time delay circuit from said threshold device until said resultant voltage exceeds said threshold level.

References Cited by the Examiner

UNITED STATES PATENTS

| | | | |
|---|---|---|---|
| 3,021,438 | 2/62 | Moore et al. | 307—88.5 |
| 3,071,698 | 1/63 | Thompson et al. | 307—88.5 |
| 3,121,175 | 2/64 | Vigneron | 307—88.5 |
| 3,138,759 | 6/64 | Thompson | 328—35 XR |

DAVID J. GALVIN, *Primary Examiner.*